United States Patent
Yoneyama

(10) Patent No.: US 7,154,490 B2
(45) Date of Patent: Dec. 26, 2006

(54) DISPLAY DRIVER, ELECTRO-OPTICAL DEVICE, AND ELECTRONIC APPLIANCE

(75) Inventor: Tsuyoshi Yoneyama, Fujimi-machi (JP)

(73) Assignee: Seiko Epson Corporation (JP)

( * ) Notice: Subject to any disclaimer, the term of this patent is extended or adjusted under 35 U.S.C. 154(b) by 470 days.

(21) Appl. No.: 10/787,838

(22) Filed: Feb. 26, 2004

(65) Prior Publication Data

US 2004/0212608 A1    Oct. 28, 2004

(30) Foreign Application Priority Data

Feb. 26, 2003    (JP)    ............... 2003-049027

(51) Int. Cl.
*G09G 5/00*    (2006.01)
(52) U.S. Cl. .................. 345/204; 345/87; 345/88; 345/89; 345/98; 345/100; 345/530; 345/533; 345/559; 345/565; 345/571
(58) Field of Classification Search ............ 345/87–89, 345/98, 100, 204, 530, 533, 559, 565, 571
See application file for complete search history.

(56) References Cited

U.S. PATENT DOCUMENTS 6,674,423 B1 *    1/2004    Isozaki ................. 345/100

2002/0135604 A1    9/2002    Yoneyama

FOREIGN PATENT DOCUMENTS

| JP | 2001-142426 | 5/2001 |
| JP | 2001-350620 | 12/2001 |
| JP | 2002-328665 | 11/2002 |

* cited by examiner

*Primary Examiner*—Richard Hjerpe
*Assistant Examiner*—Jennifer T. Nguyen
(74) *Attorney, Agent, or Firm*—Harness, Dickey & Pierce, P.L.C.

(57) ABSTRACT

A display driver, electro-optical device and electronic appliance are provided that make unnecessary processing that calculates positions in a RAM where display data is to be written according to a mounting state thereof. A display driver includes a mounting state setting register in which mounting state setting data showing a mounting state of the display driver is set, a RAM that stores display data, a row scanning flag generation circuit that generates a row scanning flag showing a scanning direction of row addresses based on the mounting state setting data, a row address decoder that decodes row addresses in accordance with the scanning direction designated by the row scanning flag, a column address decoder that decodes column addresses, a display address decoder that decodes display addresses, and a driving circuit that drives a display section based on display data read from the RAM in accordance with a decoding result of the display address decoder.

11 Claims, 16 Drawing Sheets

VERTICALLY NON-INVERTED
(COM SCANNING: FORWARD DIRECTION)

VERTICALLY INVERTED
(COM SCANNING: FORWARD DIRECTION)

VERTICALLY NON-INVERTED
(COM SCANNING: REVERSE DIRECTION)

VERTICALLY INVERTED
(COM SCANNING: REVERSE DIRECTION)

WRITE DURING LOWER MOUNTING STATE

WRITE DURING UPPER MOUNTING STATE

DISPLAY DRIVER, ELECTRO-OPTICAL DEVICE, AND ELECTRONIC APPLIANCE

RELATED APPLICATIONS

The present application claims priority to Japanese Patent Application No. 2003-049027 filed Feb. 26, 2003 which is hereby expressly incorporated by reference in its entirety.

BACKGROUND

1. Field of the Invention

The present invention relates to a display driver, an electro-optical device, and an electronic appliance.

2. Description of the Related Art

Display panels, as represented by LCD (Liquid Crystal Display) panels are mounted on mobile telephones and mobile information terminals (personal digital assistants or "PDAs"). LCD panels in particular can be made smaller, have lower power consumption, and can be produced at lower cost than other types of display panels, and thus are being installed into a variety of electronic appliances.

As one example, an LCD panel includes a plurality of common electrodes and a plurality of segment electrodes, and also a plurality of pixels that are specified by the common electrodes and the segment electrodes. The segment electrodes of the LCD panel are driven based on display data by a display driver. The common electrodes of the LCD panel are scanned by a scan driver.

Power consumption can be reduced by internally providing the display driver with a RAM that stores one frame of display data, for example. The display data is supplied to the display driver by a host, such as an external MPU (Micro Processor Unit).

The RAM is composed of a plurality of RAM cells, each of which is specified using a row address and a column address. A RAM cell stores image data for one dot that composes one pixel. This array of RAM cells corresponds to the array of pixels on the LCD panel. For this reason, the host supplies display data to the display driver in accordance with the orientation of the image to be displayed on the LCD panel. In the display driver, the display data from the host is written into RAM cells that are successively designated using row addresses and column addresses. After this, the display driver reads one frame of display data during one vertical scanning period and drives the LCD panel.

An image is generated at the host using the coordinate system defined on the LCD panel (for example, coordinate axes in two dimensions with a top-left pixel of the LCD panel as the origin). The display driver that drives the LCD panel has a coordinate system defined using row addresses and column addresses (for example, coordinate axes for two dimensions with a RAM cell with a row address "0" and a column address "0" as the origin) for designating individual cells in the plurality of RAM cells that compose the RAM provided inside the display driver. The positional relationship between the respective origins of these two coordinate systems changes depending on how the display driver is arranged relative to the LCD panel.

For this reason, display drivers have been designed so that the origin of the coordinate system defined for the internal RAM can be changed and the scanning direction can also be changed.

However, there has been the problem that it has been necessary for the host to calculate row addresses and column addresses, which designate RAM cells into which display data is to be written, in accordance with a mounting state of the display driver.

The present invention was conceived in view of the technical problem described above and it is an object of the present invention to provide a display driver, an electro-optical device, and an electronic appliance that do not need to perform a process for finding positions in a RAM into which display data is to be written in accordance with a mounting state thereof.

SUMMARY

In order to solve the above problem, the present invention relates to a display driver that drives a display section based on display data, comprising: a mounting state setting register in which mounting state setting data showing a mounting state of the display driver is set; a RAM for storing the display data, a row scanning flag generating circuit that generates, based on the mounting state setting data, a row scanning flag showing a scanning direction of row addresses for writing the display data into the RAM; a row address decoder that decodes row addresses corresponding to the scanning direction designated by the row scanning flag and designates rows in the RAM; a column address decoder that decodes column addresses for writing the display data into the RAM and designates columns in the RAM; a display address decoder that decodes a display address for reading the display data from the RAM; and a driving circuit that drives the display section based on the display data read from the RAM in accordance with a decoding result of the display address decoder, wherein the display data is written into a storage region in the RAM that is specified by the row addresses and the column addresses.

According to the present invention, there is constructed a display driver including a mounting state setting register and a row scanning flag generating circuit for generating a row scanning flag showing the scanning direction of row addresses for writing display data into a RAM that stores the display data. Also, mounting state setting data showing a mounting state of the display driver is set in the mounting state setting register, and the row scanning flag is generated in accordance with the mounting state setting data. The row address decoder decodes row addresses in correspondence with the scanning direction designated by the row scanning flag.

By doing so, even in a case where there is a change in a coordinate system defined corresponding to the display section and a coordinate system defined inside the RAM in accordance with a positional relationship between the display section and the display driver, it is sufficient to set the mounting state, and processing that calculates row addresses in accordance with such positional relationship can be made unnecessary.

Also, with the display driver according to the present invention, the row address decoder may include a first row address decoder that decodes row addresses for a first scanning direction of row addresses and designates rows in the RAM and a second row address decoder that decodes row addresses for a second scanning direction of row addresses and designates rows in the RAM, with rows in the RAM being designated by the first or second row address decoder based on the row scanning flag.

According to the above invention, it is possible to perform a decoding process in accordance with a scanning direction of row addresses using an extremely simple construction.

The display driver according to the present invention may further comprise a column scanning flag generating circuit that generates, based on the mounting state setting data, a column scanning flag showing a scanning direction of column addresses, wherein the column address decoder may decode column addresses corresponding to the scanning direction designated by the column scanning flag and designate columns in the RAM.

According to the above invention, a display device is constructed so as to further comprise a column scanning flag generating circuit that generates a column scanning flag showing a scanning direction of column addresses for writing display data into a RAM that stores the display data. Mounting state setting data is set in a mounting state setting register and the column scanning flag is generated in accordance with the mounting state setting data. Column addresses are decoded in correspondence with a scanning direction designated by the column address flag.

By doing so, even in a case where there is a change in a coordinate system defined corresponding to the display section and a coordinate system defined inside the RAM in accordance with a positional relationship between the display section and the display driver, it is sufficient to set the mounting state, and processing that calculates column addresses in accordance with such positional relationship can be made unnecessary.

Also, in a display driver according to the present invention, the column address decoder may include a first column address decoder that decodes column addresses for a first scanning direction of column addresses and designates columns in the RAM and a second column address decoder that decodes column addresses for a second scanning direction of column addresses and designates columns in the RAM, with columns in the RAM being designated by the first or second column address decoder based on the column scanning flag.

According to the above invention, it is possible to perform a decoding process in accordance with a scanning direction of column addresses using an extremely simple construction.

The display driver according to the present invention may comprise a display scanning flag generating circuit that generates, based on the mounting state setting data, a display scanning flag showing a scanning direction of display addresses, wherein the display address decoder may decode display addresses corresponding to the scanning direction designated by the display scanning flag and read display data from the RAM.

According to the above invention, a display device is constructed so as to further comprise a display scanning flag generating circuit that generates a display scanning flag showing a scanning direction of display addresses for reading display data from a RAM. Mounting state setting data is set in a mounting state setting register and the display scanning flag is generated in accordance with the display state setting data. The display address decoder decodes display addresses in correspondence with a scanning direction designated by the display address flag.

By doing so, even in a case where there is a change in a coordinate system defined corresponding to the display section and a coordinate system defined inside the RAM in accordance with a positional relationship between the display section and the display driver, it is sufficient to set the mounting state, and processing that calculates display addresses in accordance with such positional relationship can be made unnecessary.

Also, in the display driver according to the present invention, the display address decoder may include a first display address decoder that decodes display addresses for a first scanning direction of display addresses and a second display address decoder that decodes display addresses for a second scanning direction of display addresses, with display data being read from the RAM in accordance with a decoding result of the first or second display address decoder based on the display scanning flag.

According to the above invention, it is possible to perform a decoding process corresponding to the scanning direction of display addresses using an extremely simple construction.

Also, in the display driver according to the present invention, the display scanning flag may be generated using the mounting state setting data and a vertical scanning flag that shows a vertical scanning direction of the display section.

According to the above invention, the display scanning flag is generated in accordance with the vertical scanning direction of the display section, so that a proper image with no vertical inversion, for example, can be displayed in view of the vertical scanning direction and the mounting state.

The present invention also relates to an electro-optical device comprising first and second electrodes that are perpendicular to one another, pixels that can be specified by the first and second electrodes, a scanning driver that drives the first electrodes, and a display driver according to any of the above description that drives the second electrodes.

The present invention also relates to an electro-optical device comprising a display panel including first and second electrodes that are perpendicular to one another and pixels that are specified by the first and second electrodes, a scanning driver that drives the first electrodes, and a display driver according to any of the above description that drives the second electrodes.

According to the above invention, it is possible to provide an electro-optical device that makes it unnecessary for a host to perform a calculation process for row addresses and the like. Accordingly, the electro-optical device can be installed in a wider range of electronic appliances.

The present invention also relates to an electronic appliance comprising an electro-optical device as described above and a display data generating circuit that generates display data to be supplied to the electro-optical device.

According to the above invention, a host does not need to perform a calculation process for row addresses and the like, and since the processing load is reduced, it is possible to provide an electronic appliance where the load of image generation processing and display processing is light.

DETAILED DESCRIPTION

The present invention will now be described in detail with reference to the drawings showing preferred embodiments thereof. It should be noted that the embodiments described below do not limit the scope of the invention as defined in the range of the patent claims. Further, no part of the constructions described below represents an essential structural element for the present invention.

Figure 1:
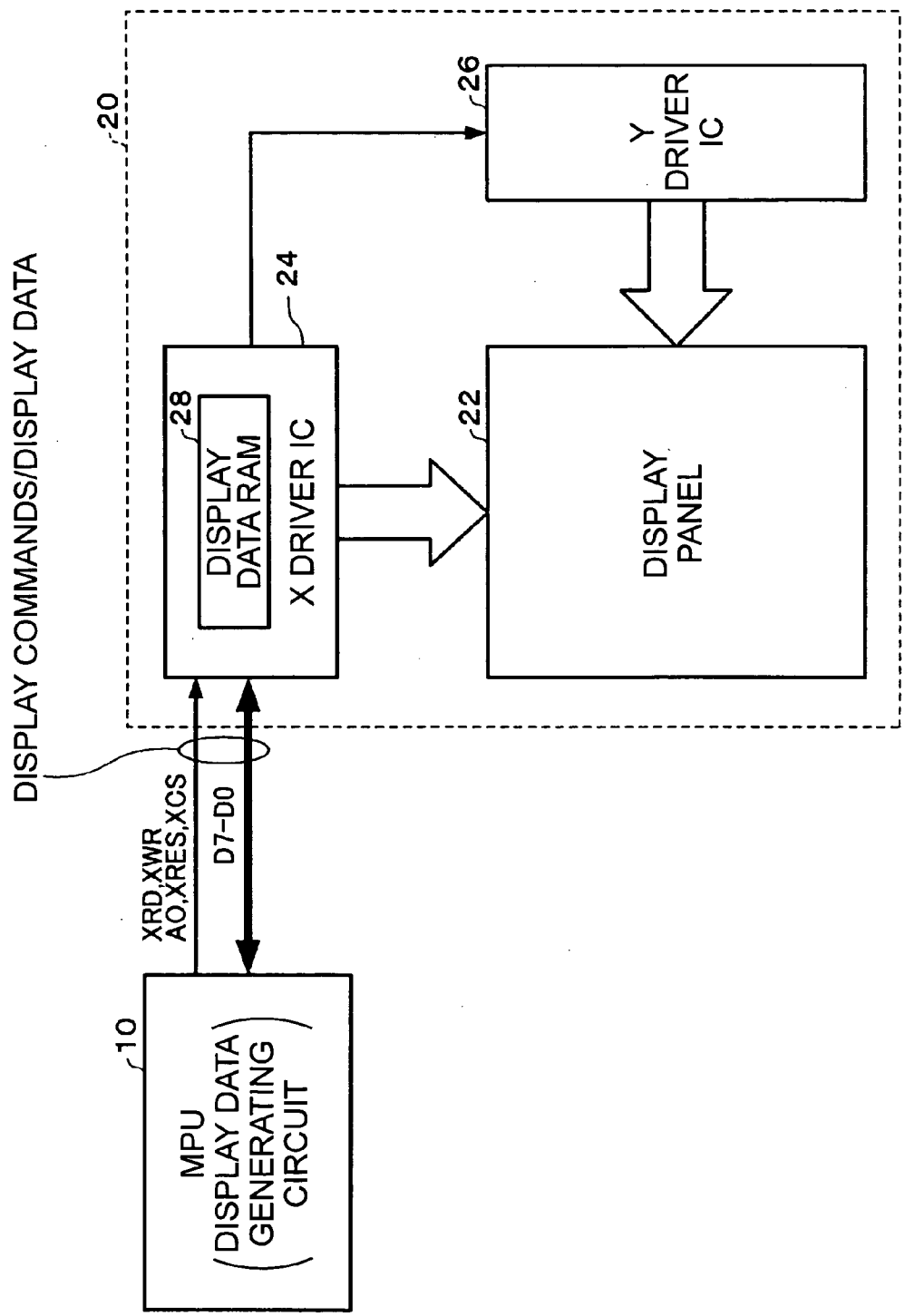
FIG. 1 is a schematic block diagram showing an electronic appliance including an electro-optical device in which a display driver according to an embodiment of the present invention is used.

FIG. 1 is a schematic block diagram showing an electronic appliance including an electro-optical device in which a display driver according to an embodiment of the present invention is used. This electronic appliance includes an MPU 10 and a display unit 20 (in a broad sense, an electro-optical device). The display unit 20 has a display panel 22 that is a matrix panel with an electro-optical device, an X driver IC 24 that drives the display panel 22 and is internally provided with a RAM, and a Y driver IC 26 for scanning. The display driver of the present embodiment is used as the X driver IC 24.

The display panel (in a broad sense, a display section) 22 may be a display using liquid crystals, whose optical characteristics change according to an applied voltage, or any other kind of electro-optical elements. The display panel 22 can be constructed of a simple matrix panel, for example. In this case, liquid crystals are sealed between a first substrate on which a plurality of segment electrodes (first electrodes) are formed and a second substrate on which common electrodes (second electrodes) are formed. The display panel 22 may be an active matrix panel that uses three-terminal elements or two-terminal elements, such as thin film transistors (TFT) or thin film diodes (TFD). Such an active matrix panel also has signal electrodes (first electrodes) that are driven by the X driver IC 24 with an internal RAM, and scanning electrodes (second electrodes) that are scanned by the Y driver IC (in a broad sense, a scanning electrode driving circuit) 26.

The display panel 22 may be constructed so that at least one of the X driver IC 24 and the Y driver IC 26 is formed on a glass substrate on which the pixels are formed. As one example, the display panel 22 may be constructed so as to include pixels that are specified by the first and second electrodes, an X driver IC that drives the first electrodes, and a Y driver IC that drives the second electrodes. In this case, the display panel 22 can be referred to as an electro-optical device, and can be produced with a greatly reduced mounting area so as to contribute to the reduction in the size and weight of an electronic appliance.

The X driver IC 24 includes a display data RAM (in a broad sense, "RAM") 28 that stores one frame of display data, for example.

As shown in FIG. 1, the MPU 10 supplies control signals, display commands, and display data to the display unit 20. The MPU 10 can also function as a display data generating circuit. Representative examples of the control signals include a signal A0 for distinguishing between commands and data, an inverse reset signal XRES, an inverse chip select signal XCS, an inverse read signal XRD, and an inverse write signal XWR. Data D0 to D7 are each 8-bit command data or 8-bit display data, and are distinguished according to a logic level of the command/data identification signal A0.

Figure 2:
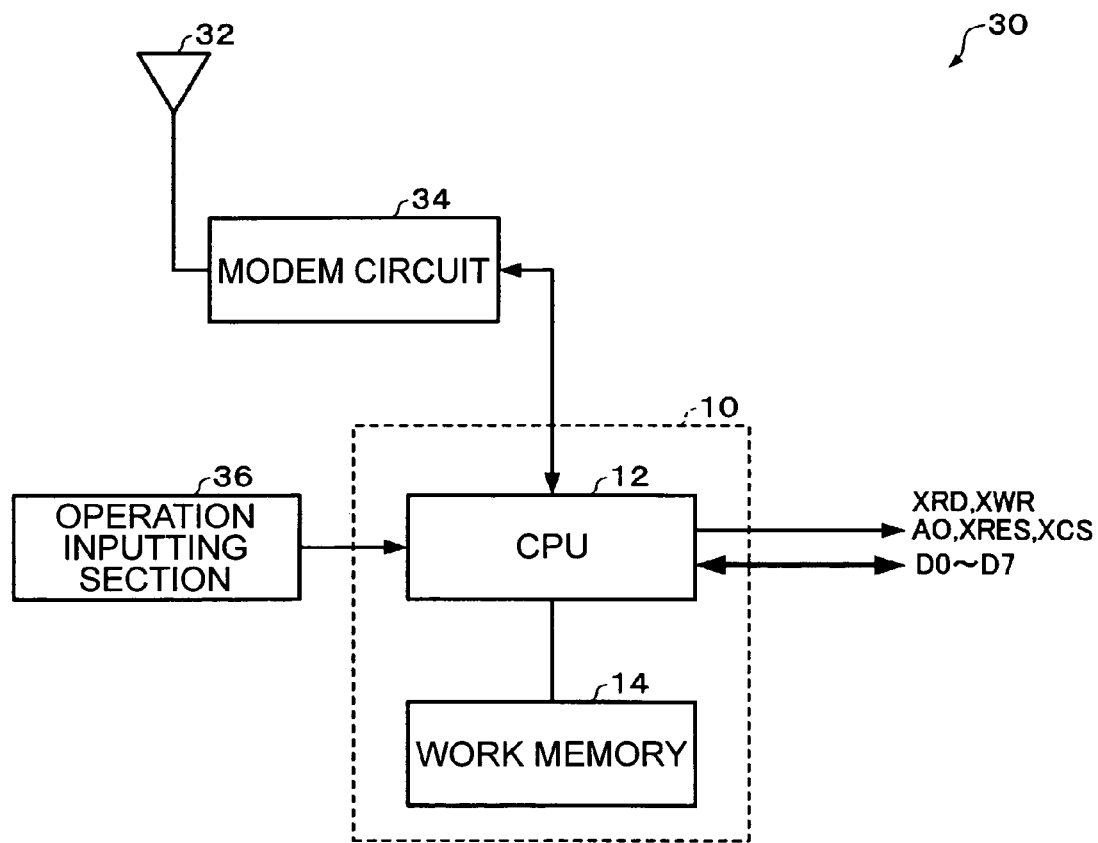
FIG. 2 is a block diagram showing an example where the MPU and the display unit shown in FIG. 1 have been installed in a mobile telephone.

FIG. 2 shows an example where the MPU 10 and the display unit 20 shown in FIG. 1 have been installed in a mobile telephone. The MPU 10 has a central processing unit (CPU) 12 that controls the mobile telephone set 30, and a work memory 14 is connected to the CPU 12. The mobile telephone set 30 is provided with a modem circuit 34 that demodulates a signal received via an antenna 32 and modulates a signal to be transmitted via the antenna 32. Operation information that is required for data transmission and reception by the mobile telephone set 30 is inputted via an operation inputting section 36.

The signal inputted via the antenna 32 is demodulated by the modem circuit 34 and then subjected to signal processing by the CPU 12. Based on information and the like from the operation inputting section 36 and using the work memory 14 as necessary, the CPU 12 outputs display data and/or various display commands for carrying out display on the display panel 22 to the display unit 20. Such display commands include commands that set various kinds of modes for controlling the operation of the X driver IC 24 that drives the display panel 22, and commands that set an area, for example, a rectangular area specified by a start address SA and an end address EA, in which a window is to be displayed in a display area of the display panel 22.

By using a construction including a display unit in which a display driver of the present embodiment (described below) is used, with the electronic appliance of the present embodiment, a calculation process for various kinds of addresses and the like does not need to be performed by the host, so that it is possible to provide an electronic appliance that has a light load for image generation processing and display processing.

Figure 3:
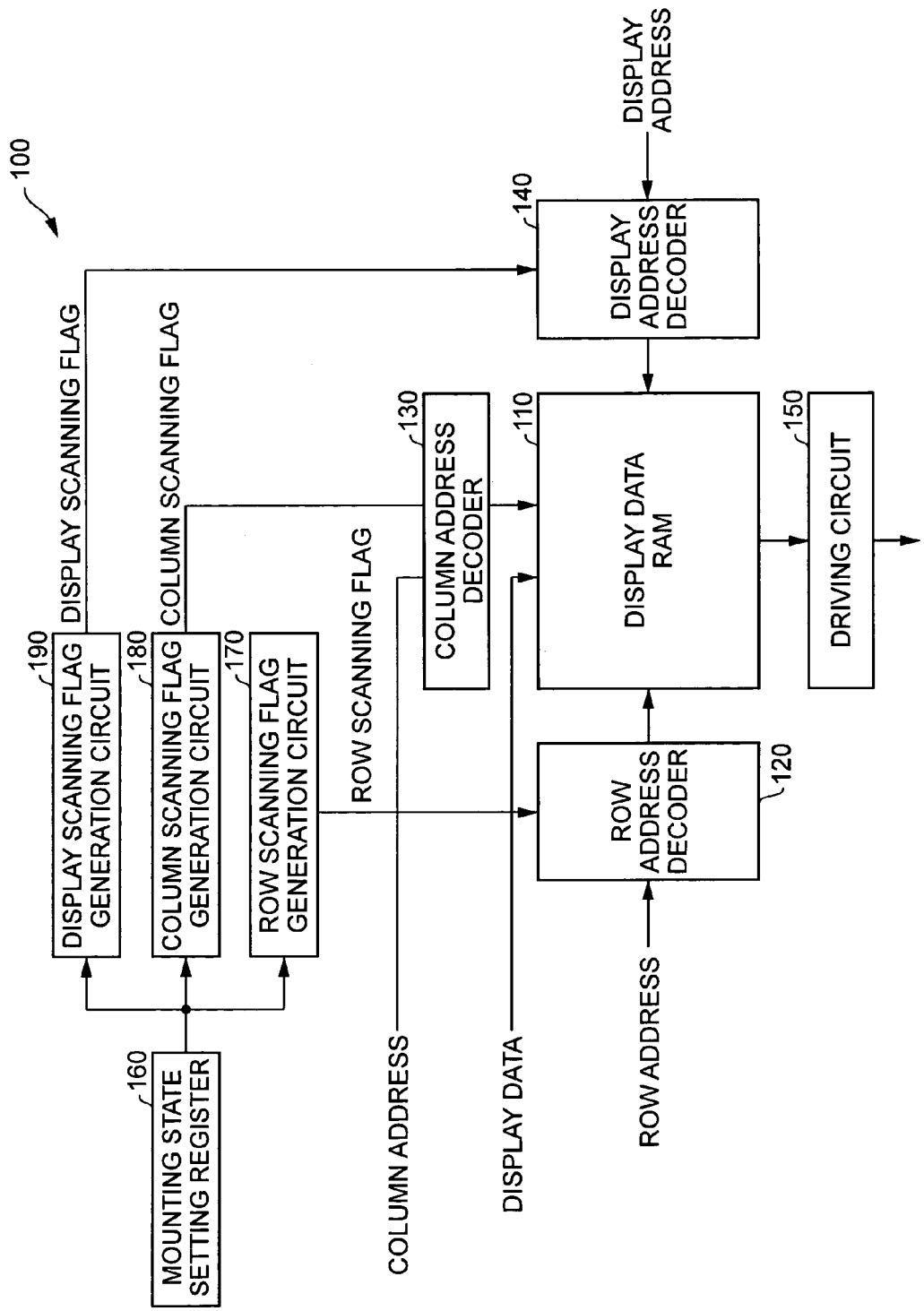
FIG. 3 is a block diagram schematically showing the construction of the display driver according to the embodiment.

FIG. 3 is a block diagram schematically showing the construction of a display driver applied to the X driver IC 24.

A display driver 100 includes a display data RAM 110. The display data RAM 110 includes a plurality of RAM cells. Each RAM cell is specified by a row address and a column address. For this reason, the display driver 100 includes a row address decoder 120 and a column address decoder 130.

The row address decoder 120 decodes row addresses and designates rows in the display data RAM 110. The column address decoder 130 decodes column addresses and designates columns in the display data RAM 110.

The display data is written into the RAM cells of the display data RAM 110 that are specified by row addresses and column addresses. The row addresses, column addresses, and display data are supplied to the row address decoder 120, the column address decoder 130, and the display data RAM 110 by a host or a control circuit, not shown (hereinafter, these are referred to simply as a "host or the like").

The display data stored in the display data RAM 110 is read at given times, in units of one line (one row), for example. For this reason, the display driver 100 includes a display address decoder 140.

The display address decoder 140 decodes display addresses. The display data of the line designated by a decoding result for a display address produced by the display address decoder 140 is read from the display data RAM 110. Display addresses are supplied from the host or the like in the same way as row addresses or column addresses.

A driving circuit 150 drives the display panel 22 based on display data read from the display data RAM 110.

The display driver 100 also includes a mounting state setting register 160. Mounting state setting data that shows a mounting state of the display driver 100 is set in this mounting state setting register 160 by a host. For example, the mounting state setting data can be data that shows whether the display driver 100 has been mounted on an upper side of the display panel 22 or has been mounted on a lower side.

In the display driver 100, at least one of the row address decoder 120, the column address decoder 130, and the display address decoder 140 can perform decoding in accordance with a scanning direction of addresses. The scanning direction of addresses is determined based on the mounting state setting data. The scanning direction of addresses can be set in a direction (an UP direction) where addresses are incremented and a direction (a DOWN direction) where addresses are decremented.

For this reason, the display driver 100 may include at least one of a row scanning flag generation circuit 170, a column scanning flag generation circuit 180, and a display scanning flag generation circuit 190. In FIG. 3, the display driver 100 includes a row scanning flag generation circuit 170, a column scanning flag generation circuit 180, and a display scanning flag generation circuit 190.

The row scanning flag generation circuit 170 sets a row scanning flag based on the mounting state setting data set in the mounting state setting register 160. The row scanning flag shows the scanning direction of row addresses. The scanning direction shows one of an UP direction (a first scanning direction) and a DOWN direction (a second scanning direction).

The column scanning flag generation circuit 180 sets a column scanning flag based on the mounting state setting data set in the mounting state setting register 160. The column scanning flag shows the scanning direction of column addresses. The scanning direction shows one of an UP direction (a first scanning direction) and a DOWN direction (a second scanning direction).

The display scanning flag generation circuit 190 sets a display scanning flag based on the mounting state setting data set in the mounting state setting register 160. The display scanning flag shows the scanning direction of display addresses. The scanning direction shows one of an UP direction (a first scanning direction) and a DOWN direction (a second scanning direction).

Figure 4:
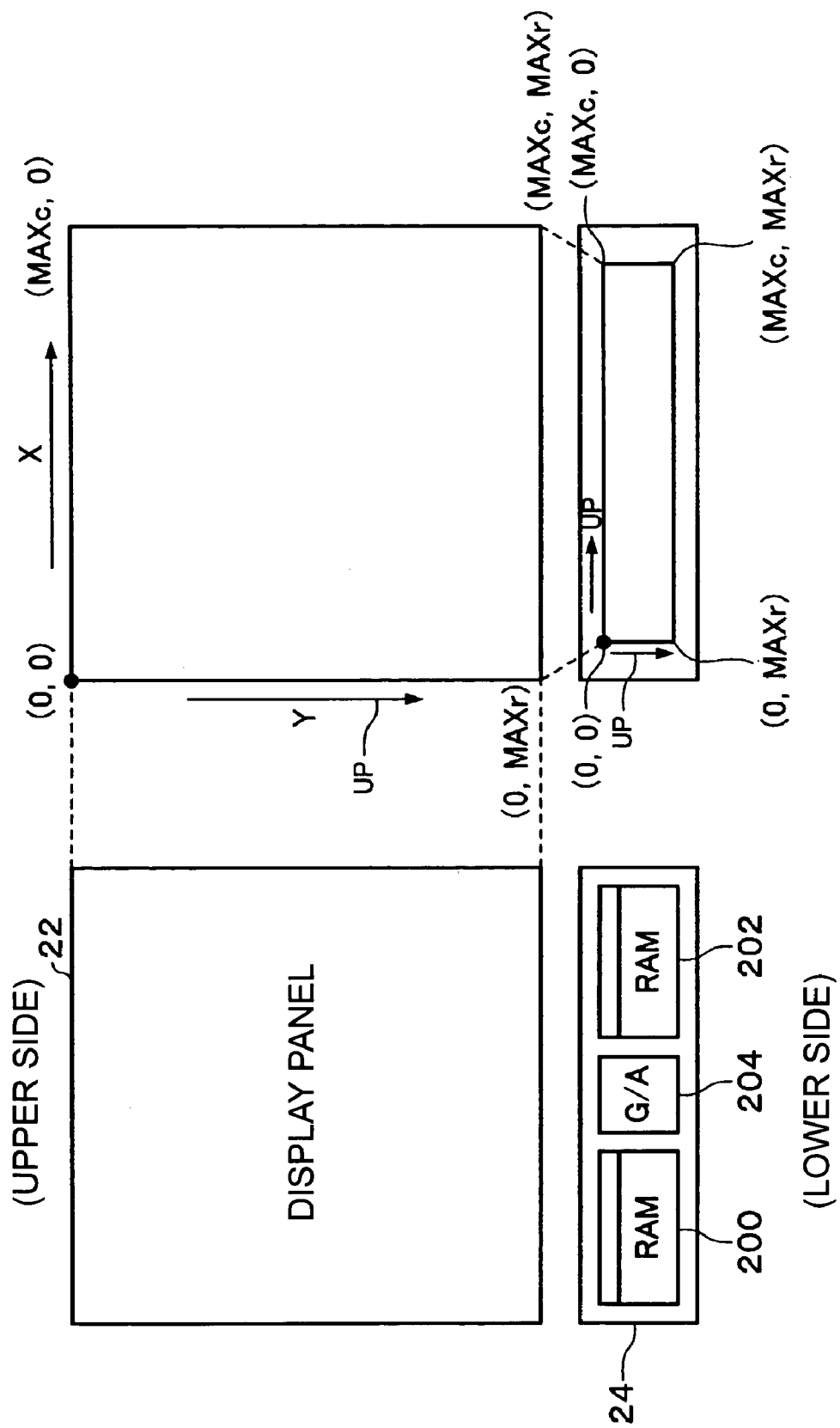
FIG. 4 is a schematic diagram showing a coordinate system defined on a display panel and a coordinate system defined by row addresses and column addresses of a display data RAM.

FIG. 4 is a schematic diagram showing a coordinate system defined on the display panel and a coordinate system defined by the row addresses and column addresses of the display data RAM. In FIG. 4, a state (lower side mounting state) where the X driver IC 24 is mounted on the lower side of the display panel 22 is shown.

The X driver IC 24 includes two RAM sections 200 and 202 produced by physically dividing the display data RAM 110 into two regions and a gate array (G/A) section 204 composed of control logic for accessing the display data RAM 110 and the like. The G/A section 204 is formed in a region between the RAM sections 200 and 202.

A logical coordinate system is defined for specifying individual RAM cells in the display data RAM 110 of this X driver IC 24. Here, the minimum value of the row address is set at zero, the maximum value is set at MAXr, the minimum value of the column address is set at zero, and the maximum value is set at MAXc.

Each pixel on the display panel 22 is associated with a RAM cell in the display data RAM 110. Also, on the display panel 22, the coordinate system is defined with an X direction and Y direction as shown in FIG. 4 with a top-left pixel as an origin (0,0), for example.

Figure 5:
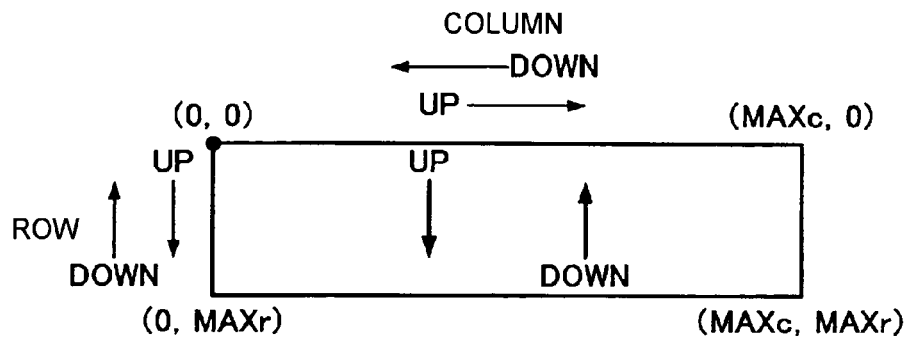
FIG. 5 is a schematic diagram showing the scanning directions for row addresses and column addresses.

FIG. 5 is a schematic diagram showing the scanning directions of row addresses and column addresses.

The host or the like designates row addresses and column addresses so that an image is correctly displayed on the coordinate system of the display panel 22 and writes display data into the display data RAM 110 of the X driver IC 24. More specifically, the host or the like designates the UP direction as the scanning direction of row addresses and supplies row addresses, and also designates the UP direction as the scanning direction of column addresses and supplies column addresses. The host or the like writes the display data into RAM cells specified using such row addresses and column addresses.

As shown in FIG. 5, the UP direction of row addresses is the direction moving from the minimum value of the row addresses for designating rows in the display data RAM 110 towards the maximum value. Also, as shown in FIG. 5, the DOWN direction of row addresses is the direction moving from the maximum value of the row addresses towards the minimum value.

As shown in FIG. 5, the UP direction of column addresses is the direction moving from the minimum value of the column addresses for designating columns in the display data RAM 110 towards the maximum value. Also, as shown in FIG. 5, the DOWN direction of column addresses is the direction moving from the maximum value of the column addresses towards the minimum value.

In this way, the display data written into the display data RAM 110 is read in single line units, for example, in accordance with display addresses designated by the host or the like. At this time, display data is successively read in single line units, for example, according to the scanning direction of display addresses.

As shown in FIG. 5, the UP direction of display addresses is the direction moving from the minimum value of the display addresses for reading out display data from the display data RAM 110 towards the maximum value. Also, as shown in FIG. 5, the DOWN direction of display addresses is the direction moving from the maximum value of the display addresses towards the minimum value.

However, in a state ("upper side mounting") where the display driver is mounted on the upper side of the display panel 22, or in a case where the orientation of the display image of the display panel 22 is vertically inverted, after calculating a row address and a column address of the display data RAM, the host or the like needs to designate the row address and column address to the X driver IC 24 and to designate the scanning direction of display addresses. This relates not only to the case where the display driver has been mounted on the upper side or lower side of the display panel 22, but also to whether an active screen of the display driver 100 is mounted with the same orientation as a display screen of the display panel 22 or whether a non-active screen of the display driver 100 has been mounted with the same orientation as the display screen of the display panel 22.

In the display driver 100 according to the present embodiment, decoding control of the row address decoder 120, the column address decoder 130, and the display address decoder 140 is carried out according to the mounting state setting data showing the mounting state of the display driver 100. By doing so, processing that calculates row addresses and column addresses at the host can be made unnecessary, and by merely setting the mounting state, row addresses and column addresses can be designated in the proper manner.

Figure 6:
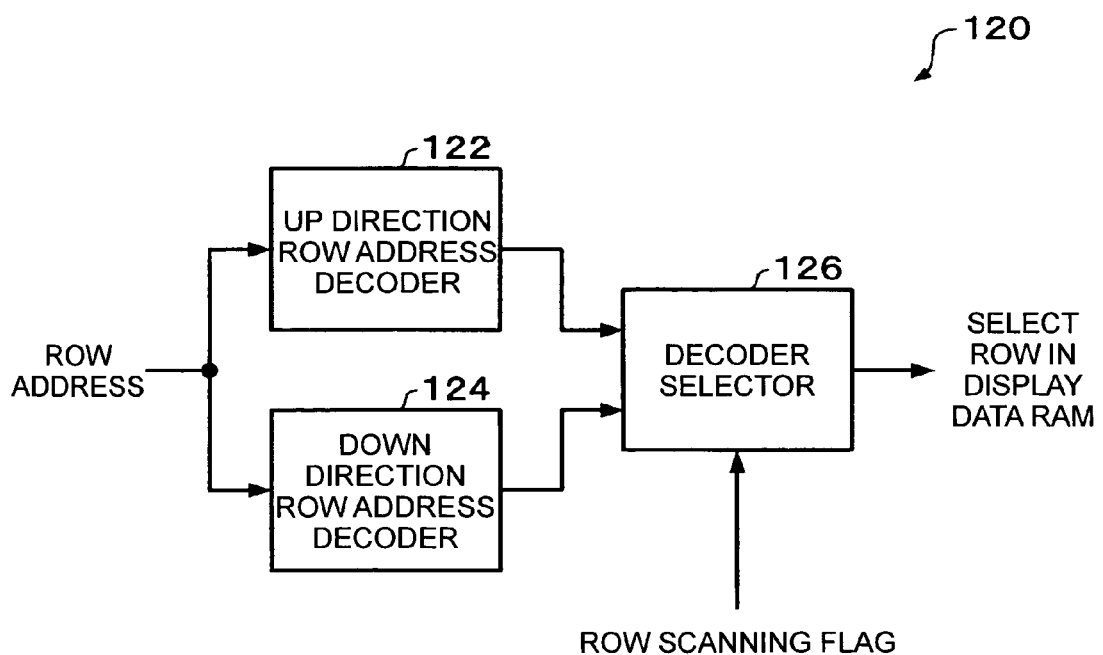
FIG. 6 is a block diagram schematically showing the construction of the row address decoder.

FIG. 6 schematically shows the construction of the row address decoder 120. The row address decoder 120 includes an UP direction row address decoder (first row address decoder) 122, a DOWN direction row address decoder (second row address decoder) 124, and a decoder selector 126.

The UP direction row address decoder 122 performs a decoding process for the case where the scanning direction is the UP direction of row addresses. The DOWN direction row address decoder 124 performs a decoding process for the case where the scanning direction is the DOWN direction of row addresses.

Figure 7:
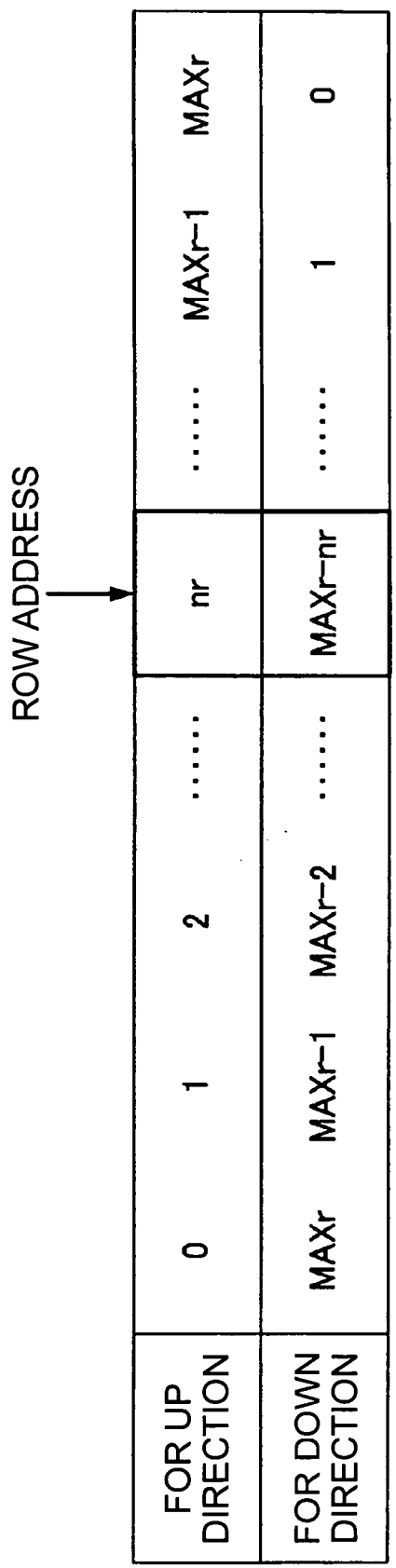
FIG. 7 is a diagram showing a model of an operation of an UP direction row address decoder and a DOWN direction row address decoder.

In FIG. 7, the operation of the UP direction row address decoder 122 and the DOWN direction row address decoder 124 is shown using a model.

When the inputted row address is nr, the UP direction row address decoder 122 selects a row in the display data RAM 110 that is designated by the row address nr without any change. On the other hand, when the inputted row address is nr, the DOWN direction row address decoder 124 selects a row in the display data RAM 110 that is designated by the row address (MAXr-nr).

When the scanning direction of row addresses is the UP direction as shown by the row scanning flag, the decoder selector 126 selects rows in the display data RAM 110 designated by the UP direction row address decoder 122. Conversely, when the scanning direction of row addresses is the DOWN direction as shown by the row scanning flag, the decoder selector 126 selects rows in the display data RAM 110 designated by the DOWN direction row address decoder 124.

In this way, the row address decoder 120 is provided in advance with a decoder for the case where the scanning direction of row addresses is the DOWN direction. By doing so, it is possible to perform a decoding process in accordance with the scanning direction using an extremely simple construction. Even in the case where the scanning direction of row addresses should be designated as the DOWN direction, the host does not need to calculate the row address (MAXr-nr) and therefore only needs to designate the row address nr as normal, which relieves the host of a row address calculation process.

Figure 8:
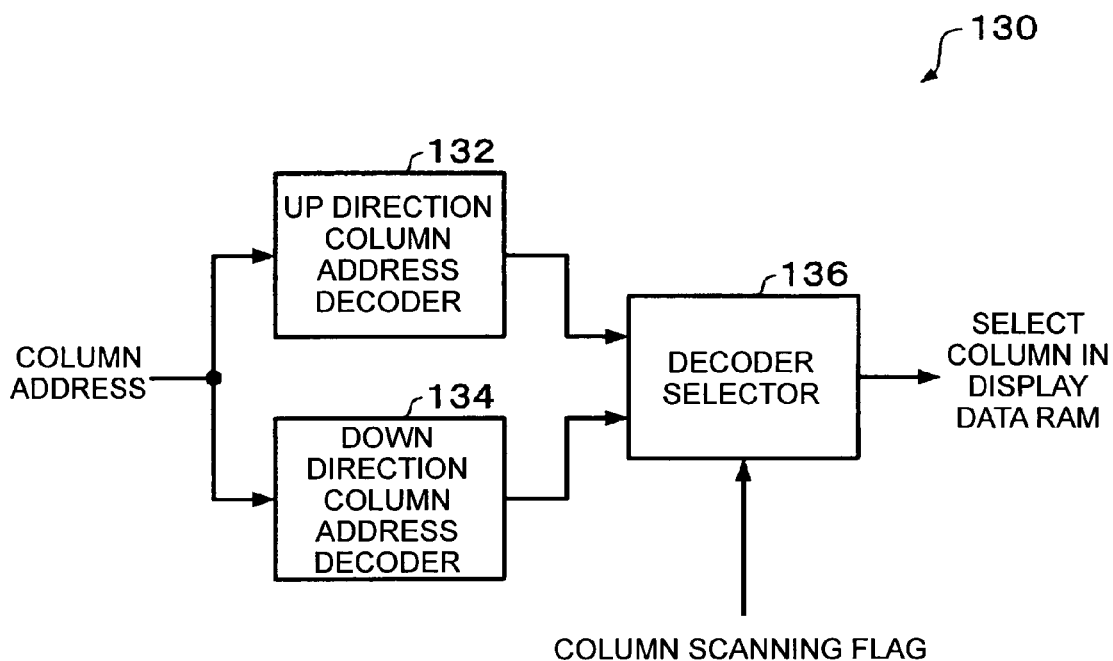
FIG. 8 is a block diagram schematically showing the construction of a column address decoder.

FIG. 8 schematically shows the overall construction of the column address decoder 130. The column address decoder 130 includes an UP direction column address decoder (first column address decoder) 132, a DOWN direction column address decoder (second column address decoder) 134, and a decoder selector 136.

The UP direction column address decoder 132 performs a decoding process for the case where the scanning direction is the UP direction of column addresses. The DOWN direction column address decoder 134 performs a decoding process for the case where the scanning direction is the DOWN direction of column addresses.

The decoding processing of the UP direction column address decoder 132 and the DOWN direction column address decoder 134 is the same as the decoding processing for row addresses that was shown in FIG. 7. That is, when the inputted column address is nc, the UP direction column address decoder 132 selects a column in the display data RAM 110 that is designated by the column address nc without any change. On the other hand, when the inputted column address is nc, the DOWN direction column address decoder 134 selects a column in the display data RAM 110 that is designated by the column address (MAXc-nc).

When the scanning direction of column addresses is the UP direction as shown by the column scanning flag, the decoder selector 136 selects columns in the display data RAM 110 designated by the UP direction column address decoder 132. Conversely, when the scanning direction of column addresses is the DOWN direction as shown by the column scanning flag, the decoder selector 136 selects columns in the display data RAM 110 designated by the DOWN direction column address decoder 134.

In this way, the column address decoder 130 is provided in advance with a decoder for the case where the scanning direction of column addresses is the DOWN direction. By doing so, even in the case where the scanning direction of column addresses should be designated as the DOWN direction, the host does not need to calculate the column address (MAXc-nc) and therefore only needs to designate the column address nc as normal, which relieves the host of a column address calculation process.

Figure 9:
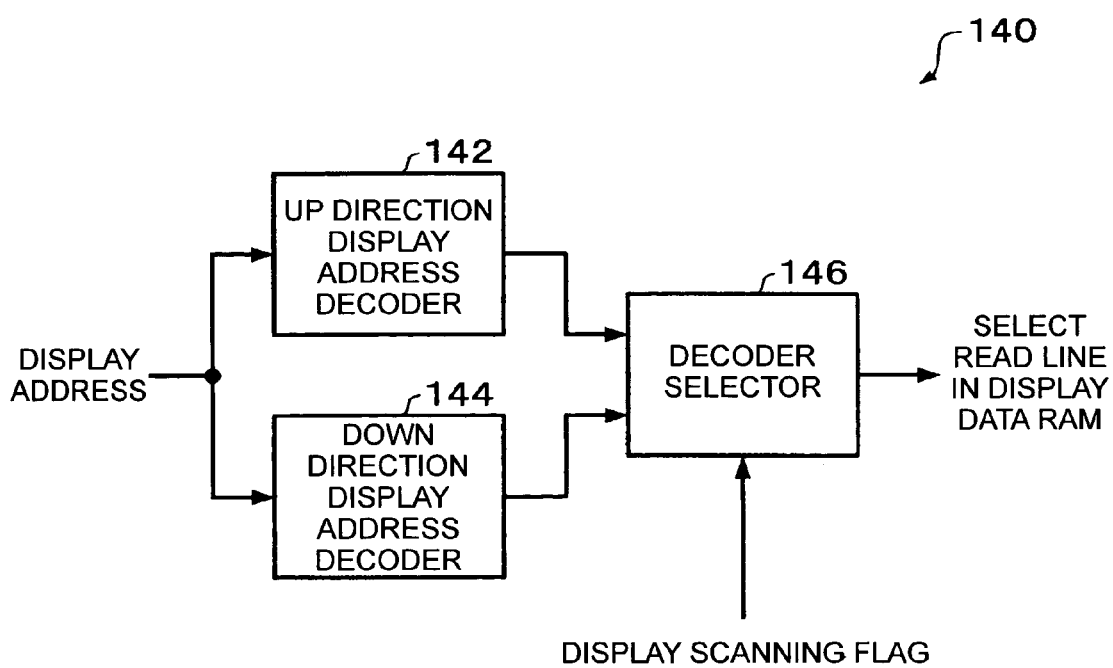
FIG. 9 is a block diagram schematically showing the construction of a display address decoder.

FIG. 9 schematically shows the construction of the display address decoder 140. The display address decoder 140 includes an UP direction display address decoder (first display address decoder) 142, a DOWN direction display address decoder (second display address decoder) 144, and a decoder selector 146.

The UP direction display address decoder 142 performs a decoding process when the scanning direction is the UP direction of display addresses. The DOWN direction display address decoder 144 performs a decoding process when the scanning direction is the DOWN direction of display addresses.

The decoding processing of the UP direction display address decoder 142 and the DOWN direction display address decoder 144 is the same as the decoding processing for row addresses that was shown in FIG. 7. That is, in a case where display data is read out in units of single rows, for example, when the inputted display address is nd, the UP direction display address decoder 142 selects one line in the display data RAM 110 that is designated by the display address nd without any change and reads the display data on that line. On the other hand, when the inputted display address is nd, the DOWN direction display address decoder 144 selects one line in the display data RAM 110 that is designated by a display address (Maxr-nd) and reads the display data on that line.

When the scanning direction of display addresses shown by the display scanning flag is the UP direction, the decoder selector 146 selects one line in the display data RAM 110 designated by the UP direction display address decoder 142 and reads the display data on the selected line. Conversely, when the scanning direction of display addresses shown by the display scanning flag is the DOWN direction, the decoder selector 146 selects one line in the display data RAM 110 designated by the DOWN direction display address decoder 144 and reads out the display data on the selected line.

In this way, the display address decoder 140 is provided in advance with a decoder for the case where the scanning direction of display addresses is the DOWN direction. By doing so, even in the case where the scanning direction of display addresses should be designated as the DOWN direction, the host does not need to calculate the display address (MAXd-nd) and therefore only needs to designate the display address nd as normal, which relieves the host of a display address calculation process.

The scanning direction of display addresses is determined in accordance with the vertical scanning direction of displaying an image on the display panel 22. The vertical scanning direction of the display panel 22 can be designated as a "forward direction" or a "reverse direction" by a COM scanning flag (vertical scanning flag). The "forward direction" for the vertical scanning direction refers to the Y direction (i.e., the UP direction of row addresses) in the coordinate system defined on the display panel 22 as shown in FIG. 4. The "reverse direction" for the vertical scanning direction refers to a direction opposite to the Y direction (i.e., the DOWN direction of row addresses) in the coordinate system defined on the display panel 22.

The orientation of the image displayed on the display panel 22 is vertically inverted in accordance with the vertical scanning direction when the image is displayed. Accordingly, the scanning direction of display addresses should preferably be determined in accordance with the vertical scanning direction as described above.

FIGS. 10(A) to 10(D) are schematic diagrams showing the scanning directions for display addresses determined in accordance with the vertical scanning direction during the lower side mounting state.

Figures 10A, 10B:
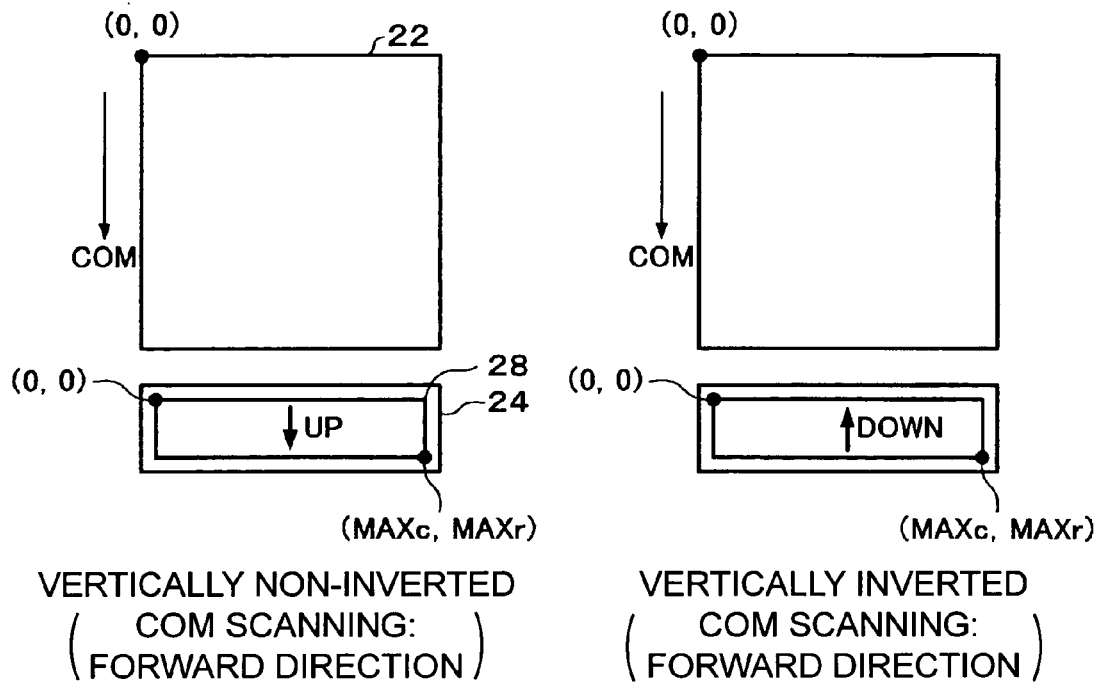
FIGS. 10(A) to 10(D) are schematic diagrams showing the scanning directions for display addresses determined in accordance with a vertical scanning direction during a lower side mounting state.

As shown in FIG. 10(A), when the vertical scanning direction is designated by the COM scanning flag as being the forward direction, in a case where an image is displayed according to "normal display" where there is no vertical change (vertically non-inverted display), the display scanning flag is generated so that the scanning direction of display addresses becomes the UP direction.

As shown in FIG. 10(B), when the vertical scanning direction is designated by the COM scanning flag as being the forward direction, in a case where an image is displayed having been vertically inverted (vertically inverted display), the display scanning flag is generated so that the scanning direction of display addresses becomes the DOWN direction.

Figures 10C, 10D:
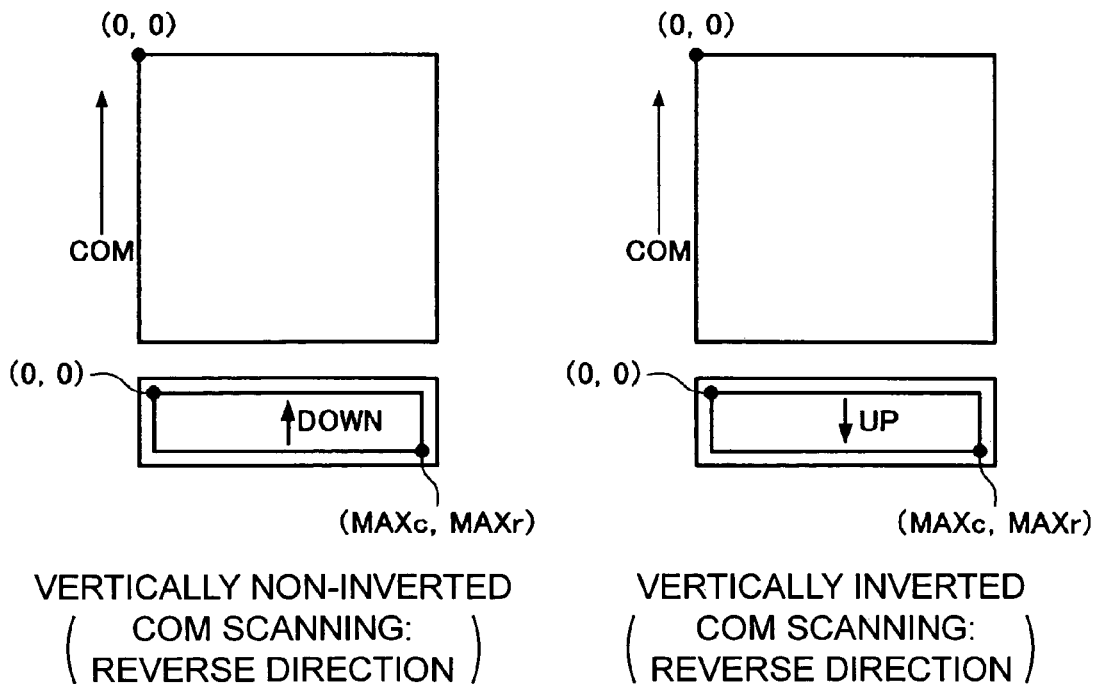

As shown in FIG. 10(C), when the vertical scanning direction is designated by the COM scanning flag as being the reverse direction, in a case where an image is displayed with no vertical change (vertically non-inverted display), the display scanning flag is generated so that the scanning direction of display addresses becomes the DOWN direction.

As shown in FIG. 10(D), when the vertical scanning direction is designated by the COM scanning flag as being the reverse direction, in a case where an image is displayed having been vertically inverted (vertically inverted display), the display scanning flag is generated so that the scanning direction of display addresses becomes the UP direction.

The explanation has thus far described the state where the display driver 100 is lower-mounted on the display panel 22 (i.e., mounted on the lower side), but a similar operation is also performed for the upper side mounting state.

Figure 11:
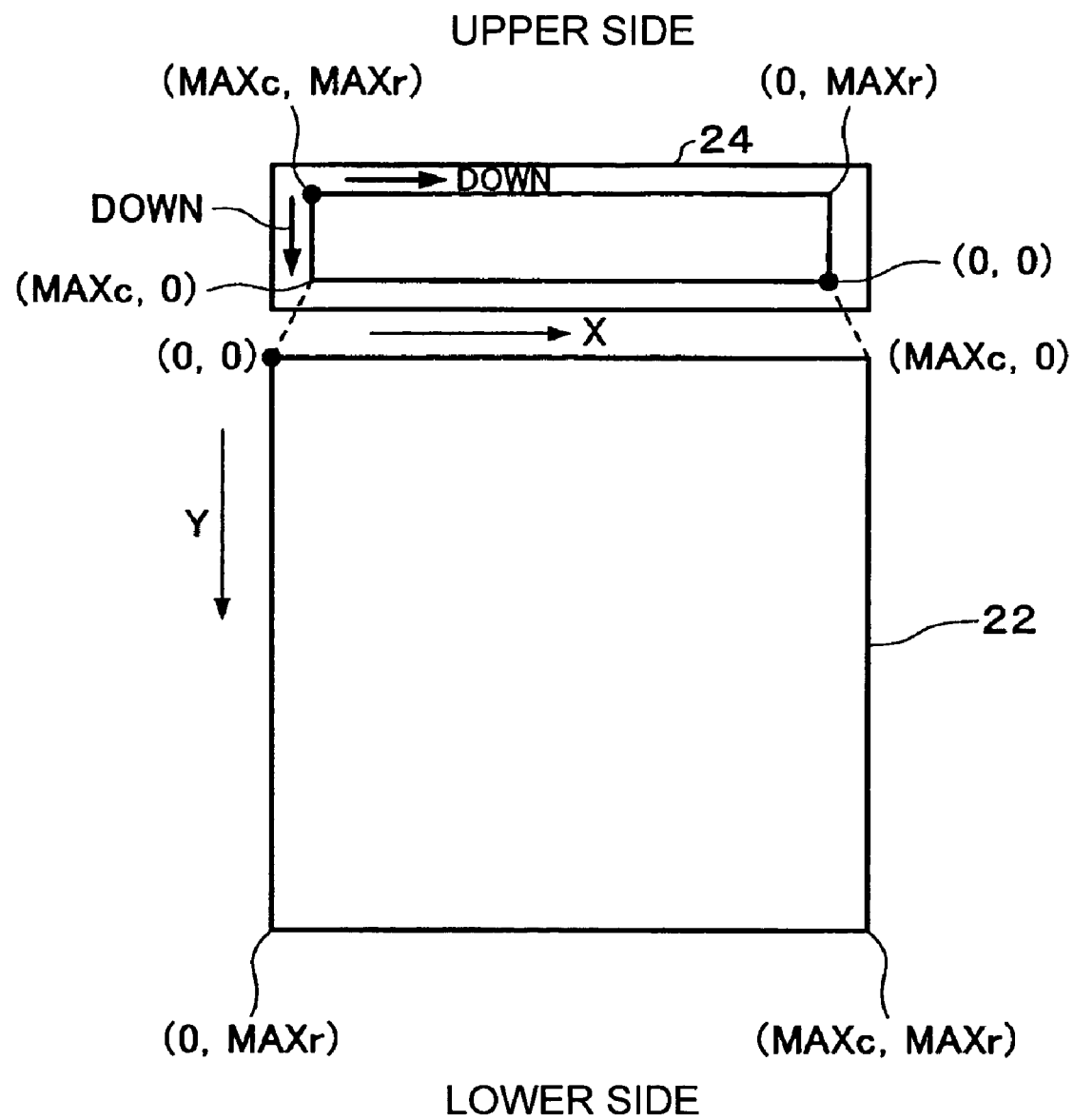
FIG. 11 is a schematic diagram showing a state where the display driver 100 is mounted on an upper side of the display panel.

FIG. 11 shows a state where the display driver 100 is upper-mounted on the display panel 22 (i.e., mounted on the upper side).

Compared to the state where the display driver 100 is lower-mounted on the display panel 22 as shown in FIG. 4, the coordinate system defined on the display panel 22 is the same, though the orientation of the coordinate system for specifying RAM cells of the display driver 100 on the X driver IC 24 differs.

The host specifies row addresses and column addresses so that an image can be properly displayed on the coordinate system of the display panel 22 and writes display data into the display data RAM 110 of the X driver IC 24. More specifically, the host specifies the DOWN direction as the scanning direction of row addresses and supplies row addresses, and also specifies the DOWN direction as the scanning direction of column addresses and supplies column addresses.

FIGS. 12(A) to 12(D) are schematic diagrams showing the scanning directions for display addresses determined in accordance with the vertical scanning direction during the upper side mounting state.

Figure 12A:
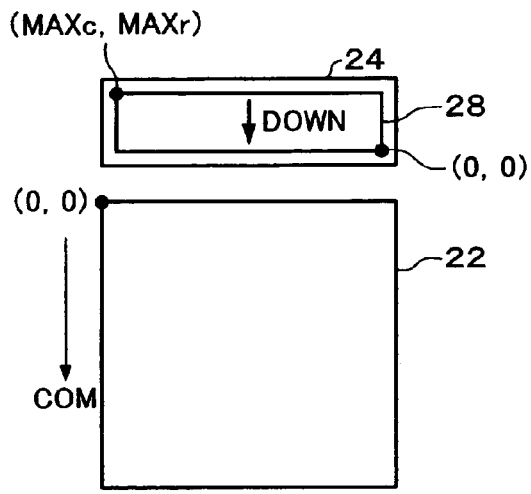
FIGS. 12(A) to 12(D) are schematic diagrams showing the scanning directions for display addresses determined in accordance with the vertical scanning direction during the lower side mounting state.

As shown in FIG. 12(A), when the vertical scanning direction is designated by the COM scanning flag as being the forward direction, in a case where an image is displayed with no vertical change (vertically non-inverted display), the display scanning flag is generated so that the scanning direction of display addresses becomes the DOWN direction.

Figure 12B:
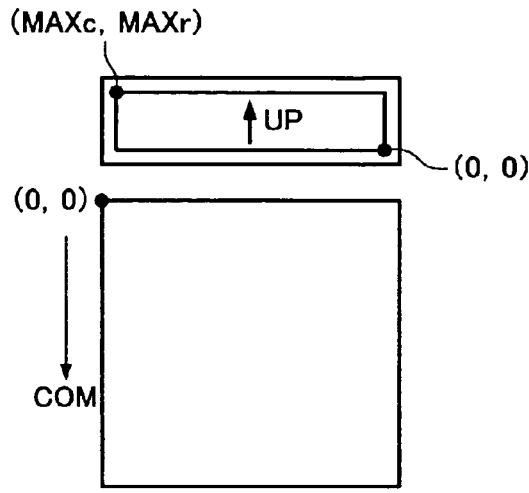

As shown in FIG. 12(B), when the vertical scanning direction is designated by the COM scanning flag as being the forward direction, in a case where an image is displayed having been vertically inverted (vertically inverted display), the display scanning flag is generated so that the scanning direction of display addresses becomes the UP direction.

Figure 12C:
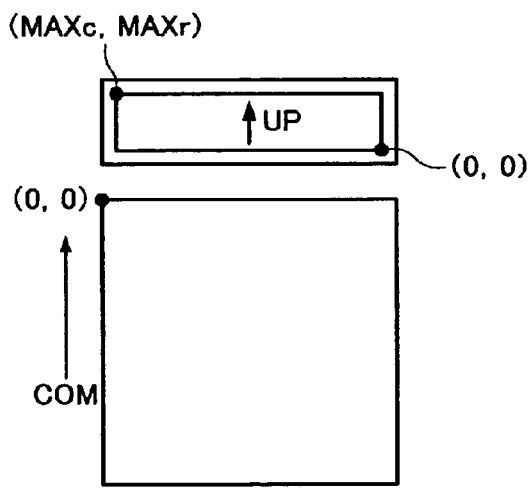

As shown in FIG. 12(C), when the vertical scanning direction is designated by the COM scanning flag as being the reverse direction, in a case where an image is displayed with no vertical change (vertically non-inverted display), the display scanning flag is generated so that the scanning direction of display addresses becomes the UP direction.

Figure 12D:
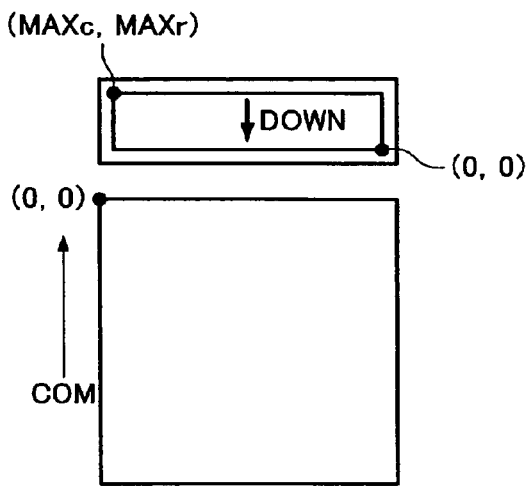

As shown in FIG. 12(D), when the vertical scanning direction is designated by the COM scanning flag as being the reverse direction, in a case where an image is displayed having been vertically inverted (vertically inverted display), the display scanning flag is generated so that the scanning direction of display addresses becomes the DOWN direction.

Figures 13, 14:
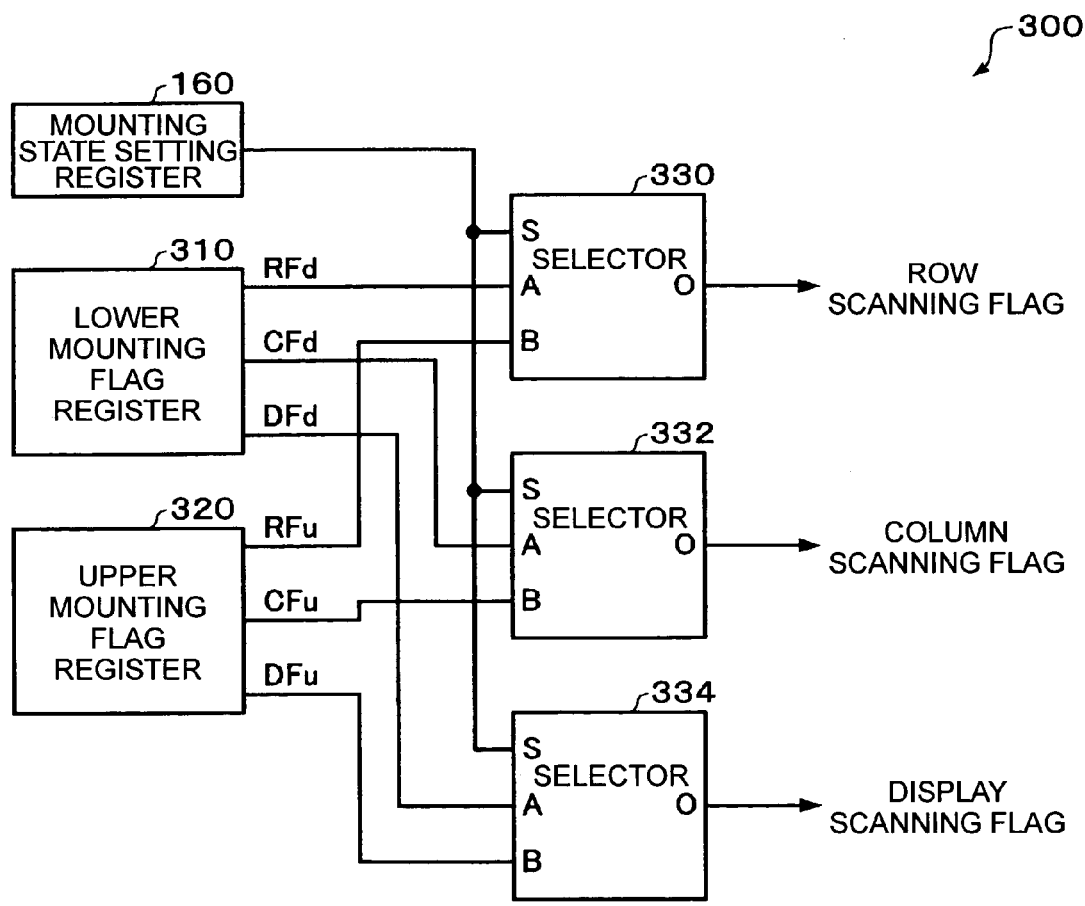
FIG. 13 is a schematic diagram showing the various scanning directions that are determined in accordance with the mounting state of the display driver.
FIG. 14 is a block diagram of an exemplary construction of a scanning flag generating circuit that generates various kinds of scanning flags in accordance with the mounting state of the display driver.

FIG. 13 shows the various scanning directions that are determined in accordance with the mounting state of the display driver 100.

FIG. 14 shows an exemplary construction of a scanning flag generating circuit that generates the various kinds of scanning flags for designating the scanning directions shown in FIG. 13 in accordance with the mounting state of the display driver 100.

A scanning flag generating circuit 300 shown in FIG. 14 has the functions of the various sections of the mounting state setting register 160, the row scanning flag generation circuit 170, the column scanning flag generation circuit 180, and the display scanning flag generation circuit 190 shown in FIG. 3.

The scanning flag generating circuit 300 includes the mounting state setting register 160, a lower mounting flag register 310, and an upper mounting flag register 320. In addition, the scanning flag generating circuit 300 includes selectors 330, 332, and 334.

A lower mounting row scanning flag RFd, a lower mounting column scanning flag CFd, and a lower mounting display scanning flag DFd are set in the lower mounting flag register 310 so that the scanning directions described above are used when a lower side mounting is used for the display driver 100.

An upper mounting row scanning flag RFu, an upper mounting column scanning flag CFu, and an upper mounting display scanning flag DFu are set in the upper mounting flag register 320 so that the scanning directions described above are used.

In accordance with a mounting state shown by mounting state setting data 2 set in the mounting state setting register 160, the selectors 330, 332, and 334 output the settings of the lower mounting flag register 310 or of the upper mounting flag register 320 as the scanning flags.

In FIG. 14, the display scanning flag is generated regardless of the COM scanning flag, but it is also possible for a scanning flag generating circuit 350 described below to generate a display scanning flag in accordance with the vertical scanning direction designated by the COM scanning flag.

Figure 15:
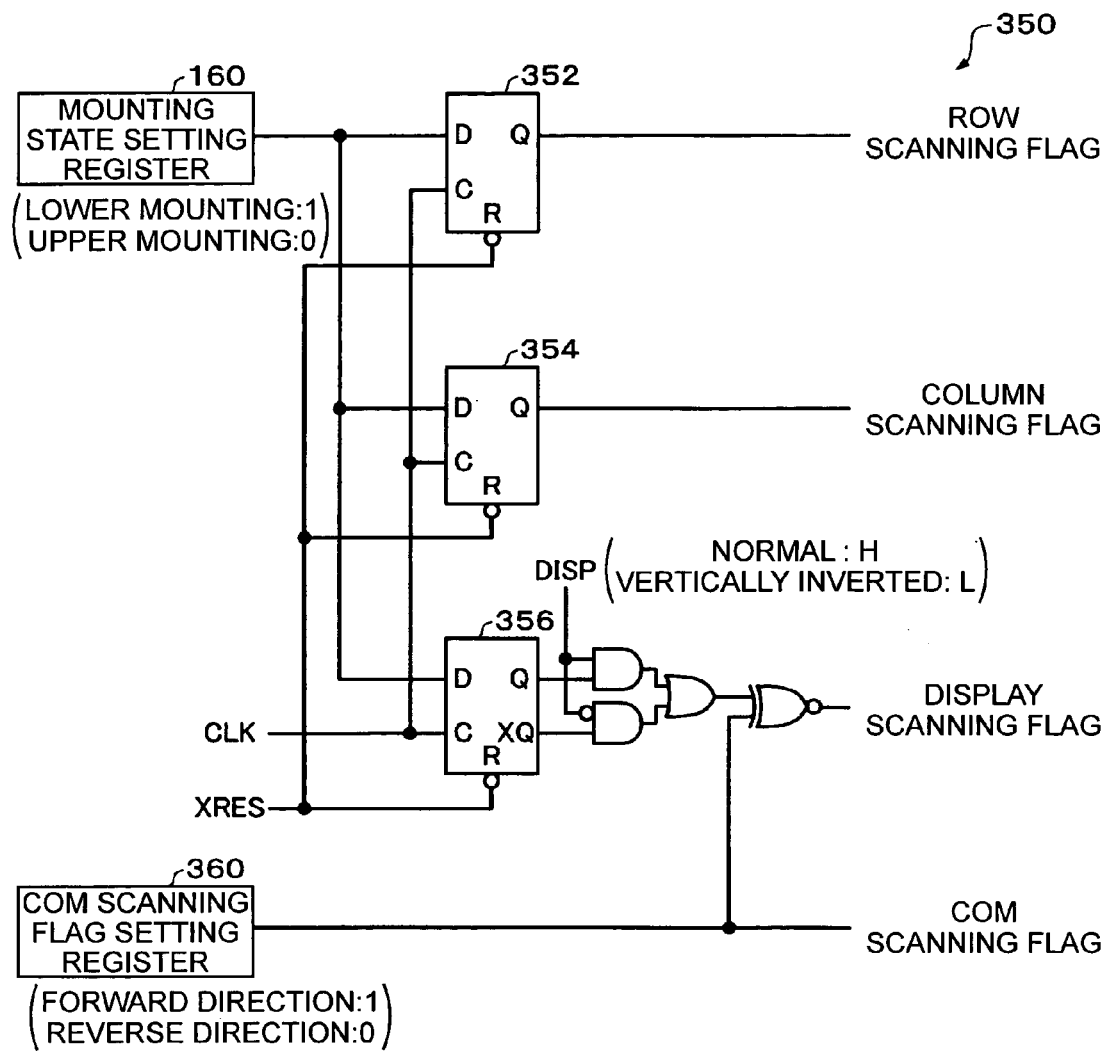
FIG. 15 is a block diagram of another exemplary construction of a scanning flag generating circuit.

In FIG. 15, another exemplary construction of a scanning flag generating circuit is shown. The scanning flag generating circuit 350 shown in FIG. 15 is constructed so that mounting state setting data with a value "1" shows a lower side mounting or a value "0" showing an upper side mounting is set in the mounting state setting register 160.

The COM scanning flag is set in a COM scanning flag setting register 360. The COM scanning flag is set at "1" when the vertical scanning direction is the forward direction and is set at "0" when the vertical scanning direction is the reverse direction.

The mounting state setting data is inputted into respective D terminals of D flip-flops (DFFs) 352, 354, and 356. The DFFs 352, 354, and 356 each hold an input signal received via the D terminal at an edge of an input signal CLK received via respective C terminals and output logic levels corresponding to the held signals via respective Q terminals. The DFFs 352, 354, and 356 are reset when an input signal XRES inputted via respective R terminals is at an "L" level.

The row scanning flag is outputted from the Q terminal of the DFF 352. The column scanning flag is outputted from the Q terminal of the DFF 354.

The display scanning flag is generated using the mounting state setting data and the COM scanning flag (the vertical scanning flag showing the vertical scanning direction of the display section). More specifically, a signal held in the DFF 356 is selectively outputted in accordance with a display control signal DISP showing whether vertically inverted display or vertically non-inverted display is being performed. A result of an exclusive OR calculated for this signal that is selectively outputted and the COM scanning flag (in a broad sense, an exclusive OR calculation result) is outputted as the display scanning flag.

Figure 16A:
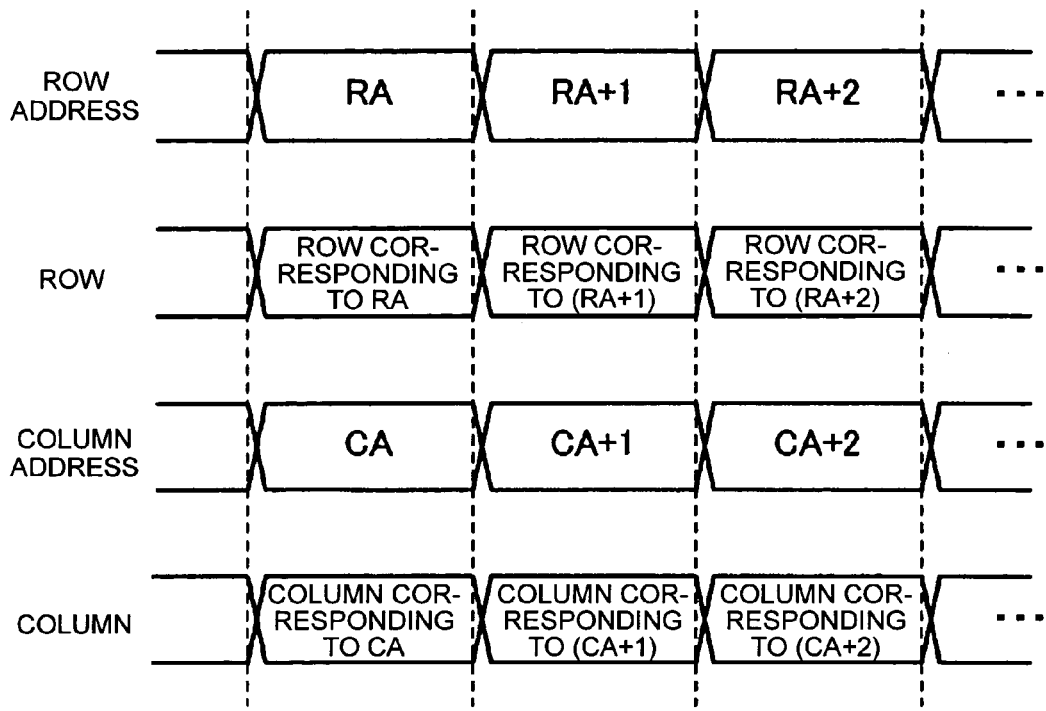
FIGS. 16(A) and 16(B) are timing charts showing examples of write timing of display data during a lower side mounting state and during an upper side mounting state.
Figure 16B:
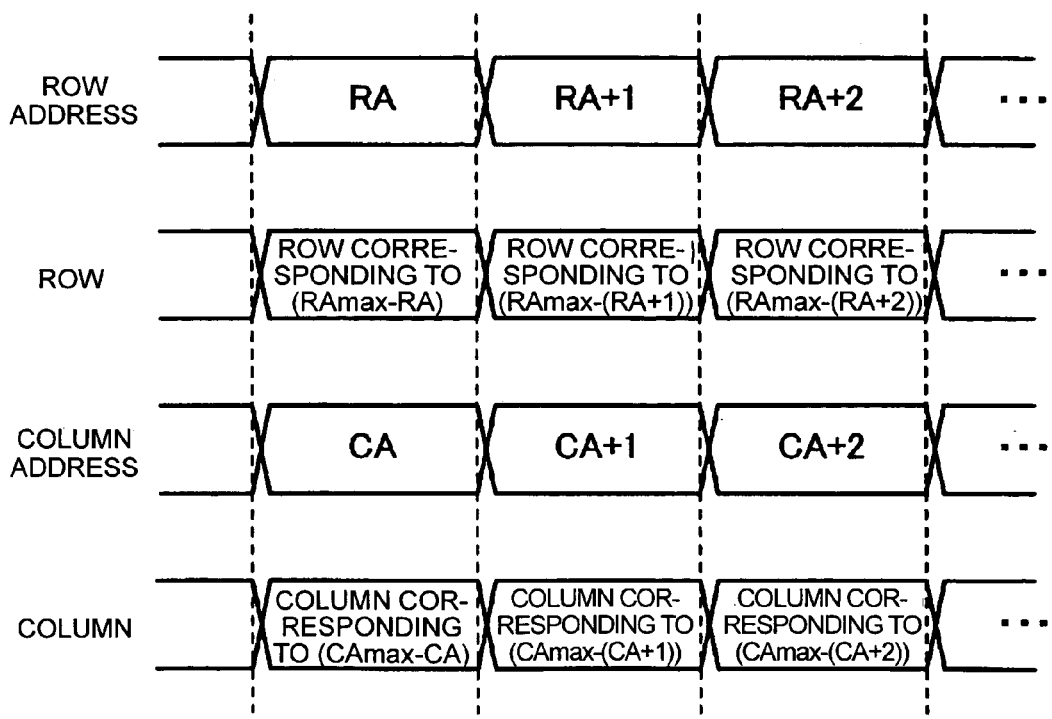

FIGS. 16(A) and 16(B) show examples of write timing of display data during the lower side mounting state and during the upper side mounting state.

FIG. 16(A) shows the write timing of display data during the lower side mounting state. The writing of display data during the lower side mounting state is performed with the UP direction as the scanning direction of row addresses and the UP direction as the scanning direction of column addresses as shown in FIGS. 4 and 13. Accordingly, when row addresses and column addresses are successively supplied, rows corresponding to the respective row addresses and columns corresponding to respective column addresses are successively designated.

FIG. 16(B) shows the write timing of display data during the upper side mounting state. The writing of display data during the upper side mounting state is performed with the DOWN direction as the scanning direction of row addresses and the DOWN direction as the scanning direction of column addresses as shown in FIGS. 11 and 13. Accordingly, when row addresses and column addresses are successively supplied, rows decoded for the DOWN direction corresponding to respective row addresses and columns decoded for the DOWN direction corresponding to respective column addresses are successively designated.

It should be noted that the read timing has not been shown since one line decoded for a display address is read in the same way.

Next, the detailed construction of the X driver IC 24, to which the display driver 100 of the present embodiment has been applied, will be explained in detail.

Figure 17:
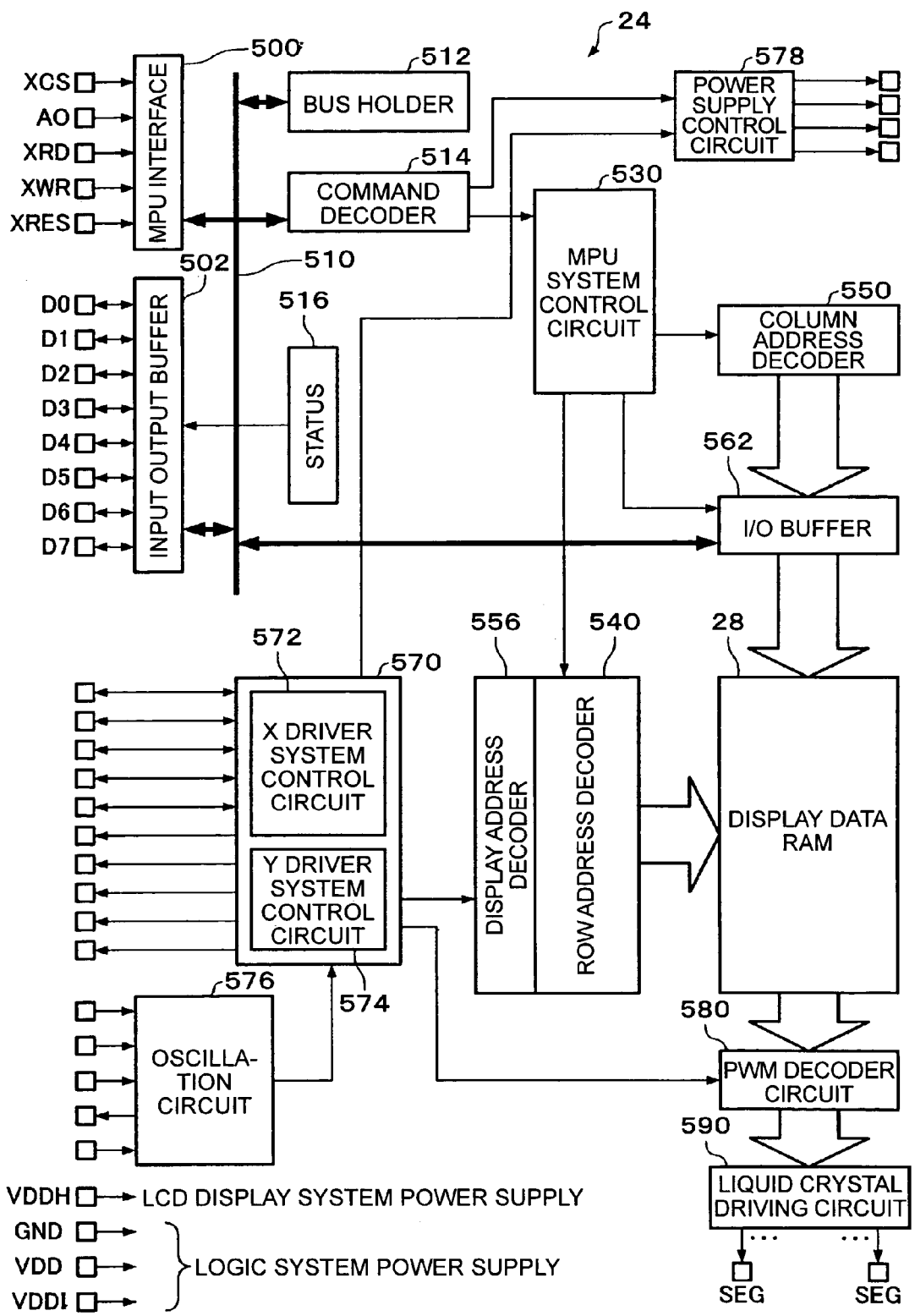
FIG. 17 is a block diagram of a detailed example construction of an X driver IC.

FIG. 17 shows the detailed construction of the X driver IC 24. An MPU interface 500 and an input/output buffer 502 are provided as an input/output circuit of the X driver IC 24. An inverse chip select signal XCS, a command/data identification signal A0, an inverse read signal XRD, an inverse write signal XWR, an inverse reset signal XRES, and the like are inputted into the MPU interface 500. For example, 8-bit commands or display data D0 to D7 are inputted into the input/output buffer 502. The X driver IC 24 is also provided with a bus line 510 that is connected to the MPU interface 500 and the input/output buffer 502.

A bus holder 512 and a command decoder 514 are connected to the bus line 510. It should be noted that a status setting circuit 516 is connected to the input/output buffer 502 and an operation status of the X driver IC 24 is outputted to the MPU 10. The bus line 510 is connected to an I/O buffer 562 of the display data RAM 28, and display data that is read from and written into the display data RAM 28 is transferred via this bus line 510.

Aside from the display data RAM 28 and I/O buffer 562 described above, the X driver IC 24 is provided with an MPU system control circuit 530, a row address decoder 540, a column address decoder 550, a driver system control circuit 570, a PWM decoder circuit 580, a liquid crystal driving circuit 590, and the like.

Based on display commands from the MPU 10 that are inputted via the command decoder 514, the MPU system control circuit 530 controls read and write operations for the display data RAM 28. The row address decoder 540 and the column address decoder 550 that are controlled by the MPU system control circuit 530 are also provided. The row address decoder 540 has the same functions as the row address decoder 120 of the display driver 100 shown in FIG.

3. The column address decoder 550 has the same functions as the column address decoder 130 of the display driver 100 shown in FIG. 3.

The X driver IC 24 also includes a display address decoder 556 that is controlled by the driver system control circuit 570 and decodes a display address so as to designate a read line for each line. The display address decoder 556 includes the same functions as the display address decoder 140 of the display driver 100 shown in FIG. 3.

The driver system control circuit 570 includes an X driver system control circuit 572 and a Y driver system control circuit 574. Based on an oscillation output from an oscillation circuit 576, the driver system control circuit 570 generates a gradation control pulse GCP, a polarity reversal signal FR, a latch pulse LP, and the like, and controls the display address decoder 556, the PWM decoder circuit 580, a power supply control circuit 578, and the Y driver IC 26.

The PWM decoder circuit 580 latches display data of a read line in the display data RAM 28 that has been designated by the display address decoder 556 and outputs a signal with a pulse width that corresponds to a gradation level in accordance with a polarity reversal cycle. The liquid crystal driving circuit 590 shifts a signal from the PWM decoder circuit 580 to a voltage in accordance with a voltage of an LCD display system and supplies the result to a segment electrode SEG of the display panel 22 shown in FIG. 1.

The MPU system control circuit 530 shown in FIG. 17 includes the mounting state setting register 160, the row scanning flag generation circuit 170, the column scanning flag generation circuit 180, and the display scanning flag generation circuit 190 shown in FIG. 3. The COM scanning flag setting register 360 in FIG. 15 can be included in the MPU system control circuit 530 or the Y driver system control circuit 574. Also, the liquid crystal driving circuit 590 corresponds to the driving circuit 150 in FIG. 3.

Figure 18:
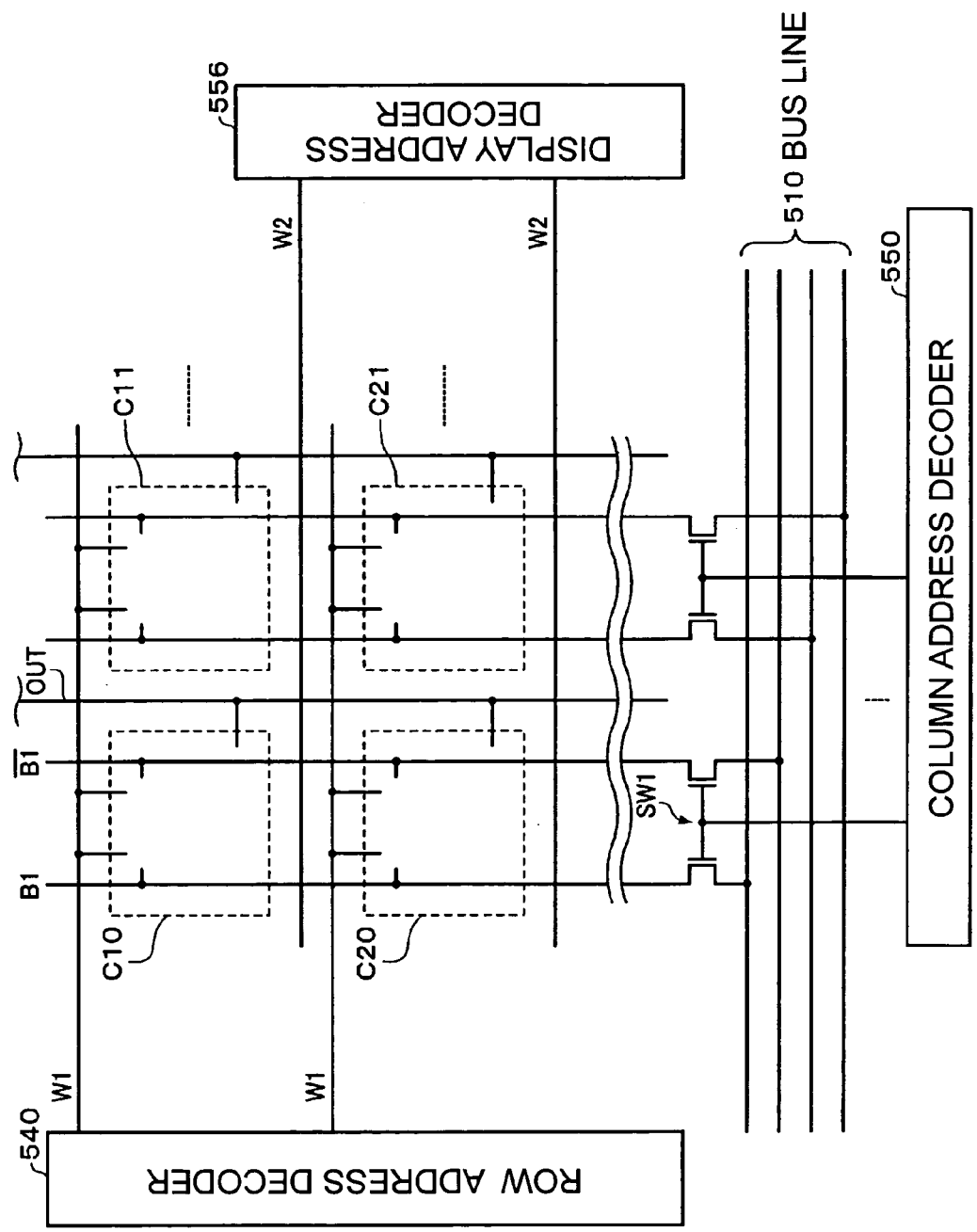
FIG. 18 is a schematic circuit diagram of a display data RAM and peripheral circuits thereof.

FIG. 18 is a schematic circuit diagram showing the display data RAM 28 and peripheral circuits thereof. In FIG. 18, RAM cells C10, C11, . . . , C20, C21, . . . on the first and second rows are shown.

In this case, the RAM cells C10, C11 are designated by adjacent column addresses. In the same way, the RAM cells C20, C21 are designated by adjacent column addresses. The RAM cells C10, C20 are designated by adjacent row addresses. In the same way, the RAM cells C11, C21 are designated by adjacent row addresses. Such RAM cells are respectively connected to a first and a second word line W1, W2, and bit line pair B1, /B1.

The row address decoder 540 outputs a signal that activates the first word line W1. The column address decoder 550 outputs a signal that turns a column switch SW1 connected to the bit line pair B1, /B1 on and off. The display address decoder 556 outputs a signal that activates the second word line W2.

When display data is written and when display data is read, the row address decoder 540 and the column address decoder 550 designate row addresses and column addresses. According to such designations of addresses, display data is read from or written into the display data RAM 28 via the bus line 510 and the column switch SW1.

The display address decoder 556 successively activates the second word lines W2 one line at a time so as to read data in every RAM cell on one line to a display data output line OUT. The read data is supplied to the PWM decoder circuit 580 shown in FIG. 17 and is used for liquid crystal driving.

Figure 19:
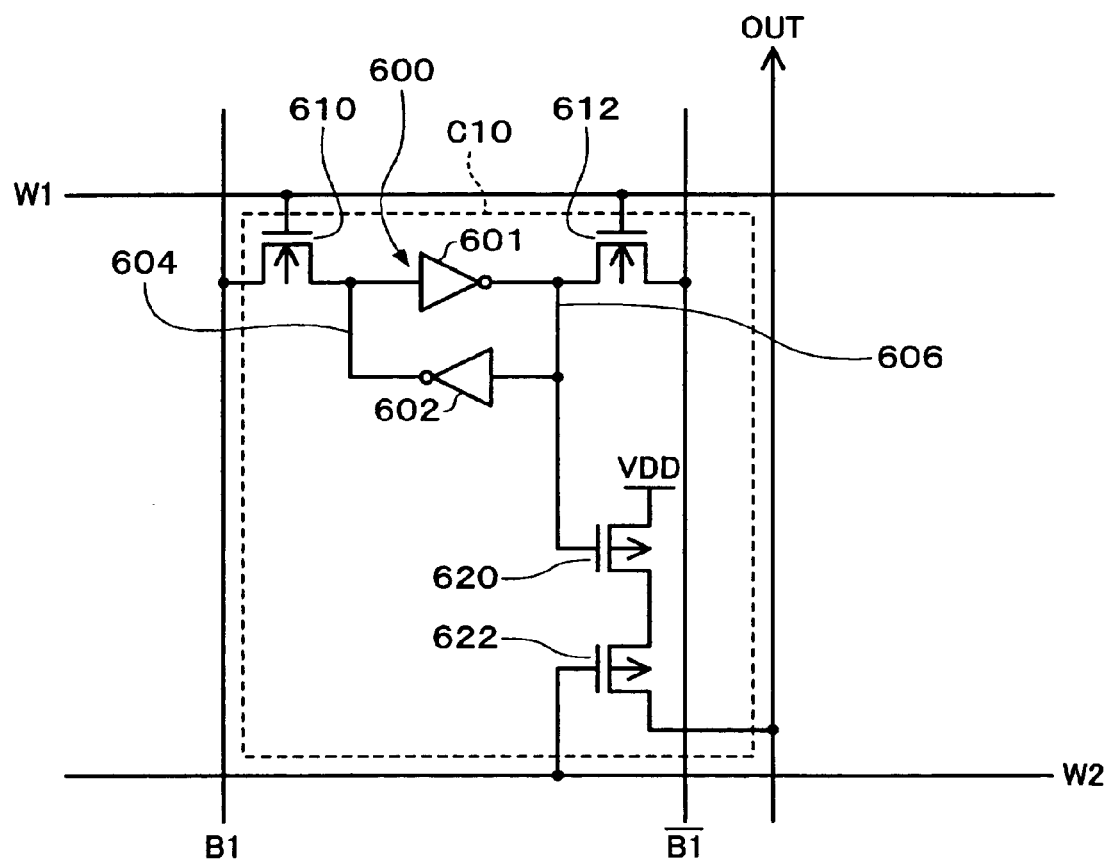
FIG. 19 is a circuit diagram of a RAM cell.

FIG. 19 is a circuit diagram for a RAM cell C10. The RAM cell C10 has the same construction as the other RAM cells. This RAM cell C10 has a memory element 600 that is constructed of two CMOS inverters 601, 602. The two CMOS inverters 601, 602 respectively have a first and second wire 604, 606 that connect the respective inputs thereof to the respective outputs. A first N-type MOS transistor 610 is connected between the first wire 604 and the bit line B1. A gate of the first N-type MOS transistor 610 is connected to the first word line W1. In the same way, a second N-type MOS transistor 612 is connected between the second wire 606 and the bit line /B1. A gate of the second N-type MOS transistor 612 is connected to the first word line W1.

In this type of RAM cell, when the first word line W1 becomes "H" (i.e., a logic level corresponding to a voltage of the first word line W1 becomes "H") due to an active signal from the row address decoder 540, the first and second N-type MOS transistors 610, 612 are turned on. In this way, the RAM cell C10 is connected to the pair of bit lines B1, /B1. At this time, when the column switch SW1 is turned on by the active signal from the column address decoder 550, data corresponding to the RAM cell C10 can be read from or written into the RAM cell C10.

First and second P-type MOS transistors 620, 622 are also connected between a power supply line VDD and the display data output line OUT. A gate of the first P-type MOS transistor 620 is connected to the second wire 606. A gate of the second P-type MOS transistor 622 is connected to the second word line W2.

Before the data of the RAM cell C10 is read out to the display data output line OUT, the display data output line OUT is pre-charged to an "L" level (i e., a logic level corresponding to a voltage of the display data output line OUT becomes "L"). After this pre-charging operation, in a state where the second word line W2 has been set at "L" and the second P-type MOS transistor 622 has been turned ON, data on the display data output line OUT is latched by the PWM decoder circuit 580. At this time, if the logic level of the second wire 606 is "H" (the logic level of the first wire 604 is "L"), the display data output line OUT remains at "L". On the other hand, if the logic level of the second wire 606 is "L" (the logic level of the first wire 604 is "H"), the display data output line OUT changes to "H". By doing so, a read of display data from the display data RAM 28 can be performed in units of one entire line at a time.

It should be noted that the present invention is not limited to the embodiment described above and a variety of modifications can be made within the range covered by the scope of the present invention.

As one example, in addition to the upper side mounting and lower side mounting described, or instead of the upper side mounting and lower side mounting, mounting state setting data that shows that the active surface of the display driver 100 is mounted with the same orientation as the display surface of the display panel 22 or that the non-active surface of the display driver 100 is mounted with the same orientation as the display surface of the display panel 22 may be set in the mounting state setting register 160.

Also, out of the present invention, inventions covered by the dependent claims can be constructed with some constructional aspects of the claims upon which such dependent claims depend being omitted. The main part of the invention as described in any single independent claim may also be treated as being dependent upon any other independent claim.

What is claimed is:

1. A display driver that drives a display section based on display data, the display driver comprising:

a mounting state setting register in which mounting state setting data showing a mounting state of the display driver is set;

a RAM for storing the display data;

a row scanning flag generating circuit that generates, based on the mounting state setting data, a row scanning flag showing a scanning direction of row addresses for writing the display data into the RAM;

a row address decoder that decodes row addresses corresponding to the scanning direction designated by the row scanning flag and designates rows in the RAM;

a column address decoder that decodes column addresses for writing the display data into the RAM and designates columns in the RAM;

a display address decoder that decodes a display address for reading the display data from the RAM; and a driving circuit that drives the display section based on the display data read from the RAM in accordance with a decoding result of the display address decoder, wherein the display data is written into a storage region in the RAM that is specified by the row addresses and the column addresses.

2. The display driver according to claim 1, wherein the row address decoder includes:

a first row address decoder that decodes row addresses for a first scanning direction of row addresses and designates rows in the RAM; and a second row address decoder that decodes row addresses for a second scanning direction of row addresses and designates rows in the RAM, and rows in the RAM are designated by at least one of the first and second row address decoders based on the row scanning flag.

3. The display driver according to claim 1, further comprising:

a column scanning flag generating circuit that generates, based on the mounting state setting data, a column scanning flag showing a scanning direction of column addresses, wherein the column address decoder decodes column addresses corresponding to the scanning direction designated by the column scanning flag and designates columns in the RAM.

4. The display driver according to claim 3, wherein the column address decoder includes:

a first column address decoder that decodes column addresses for a first scanning direction of column addresses and designates columns in the RAM; and a second column address decoder that decodes column addresses for a second scanning direction of column addresses and designates columns in the RAM, and columns in the RAM are designated by at least one of the first and second column address decoder based on the column scanning flag.

5. The display driver according to claim 1, further comprising:

a display scanning flag generating circuit that generates, based on the mounting state setting data, a display scanning flag showing a scanning direction of display addresses, wherein the display address decoder decodes display addresses corresponding to the scanning direction designated by the display scanning flag and reads display data from the RAM.

6. The display driver according to claim 5, wherein the display address decoder includes:

a first display address decoder that decodes display addresses for a first scanning direction of display addresses; and a second display address decoder that decodes display addresses for a second scanning direction of display addresses, and display data are read from the RAM in accordance with a decoding result of at least one of the first and second display address decoders based on the display scanning flag.

7. The display driver according to claim 5, wherein the display scanning flag is generated using the mounting state setting data and a vertical scanning flag that shows a vertical scanning direction of the display section.

8. An electro-optical device, comprising:

first and second electrodes that are perpendicular to one another;

pixels that can be specified by the first and second electrodes;

a scanning driver that drives the first electrodes; and a display driver according to claim 1 that drives the second electrodes.

9. An electronic appliance, comprising:

an electro-optical device according to claim 8; and a display data generating circuit that generates display data to be supplied to the electro-optical device.

10. An electro-optical device, comprising:

a display panel including first and second electrodes that are perpendicular to one another and pixels that are specified by the first and second electrodes;

a scanning driver that drives the first electrodes; and a display driver according to claim 1 that drives the second electrodes.

11. An electronic appliance, comprising:

an electro-optical device according to claim 10; and a display data generating circuit that generates display data to be supplied to the electro-optical device.

* * * * *